US012655318B2

(12) United States Patent
Kurokawa et al.

(10) Patent No.: US 12,655,318 B2
(45) Date of Patent: Jun. 16, 2026

(54) POLYSILAZANE, SILICEOUS FILM-FORMING COMPOSITION COMPRISING THE SAME, AND METHOD FOR PRODUCING SILICEOUS FILM USING THE SAME

(71) Applicant: Merck Patent GmbH, Darmstadt (DE)

(72) Inventors: Masamichi Kurokawa, Kakegawa (JP); Masahiro Ishii, Kakegawa (JP); Toshiya Okamura, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 646 days.

(21) Appl. No.: 18/022,533

(22) PCT Filed: Aug. 23, 2021

(86) PCT No.: PCT/EP2021/073214
§ 371 (c)(1),
(2) Date: Feb. 22, 2023

(87) PCT Pub. No.: WO2022/043235
PCT Pub. Date: Mar. 3, 2022

(65) Prior Publication Data

US 2023/0312978 A1 Oct. 5, 2023

(30) Foreign Application Priority Data

Aug. 24, 2020 (JP) ................................ 2020-140827

(51) Int. Cl.

| | |
|---|---|
| ***C09D 183/16*** | (2006.01) |
| ***B05D 3/10*** | (2006.01) |
| ***C08G 77/62*** | (2006.01) |
| ***H10P 14/60*** | (2026.01) |
| ***H10P 14/692*** | (2026.01) |

(52) U.S. Cl.
CPC ........... *C09D 183/16* (2013.01); *B05D 3/107* (2013.01); *C08G 77/62* (2013.01); *H10P 14/6342* (2026.01); *H10P 14/6689* (2026.01); *H10P 14/69215* (2026.01)

(58) Field of Classification Search
CPC .............................. C08G 77/62; C09D 183/16
See application file for complete search history.

(56) References Cited

U.S. PATENT DOCUMENTS

| | | | | |
|---|---|---|---|---|
| 2006/0185712 | A1 | 8/2006 | Shiho et al. | |
| 2009/0305063 | A1 | 12/2009 | Hayashi | |
| 2014/0106576 | A1 | 4/2014 | Morita et al. | |
| 2015/0111046 | A1 * | 4/2015 | Murota | C09D 183/16 427/515 |
| 2016/0379817 | A1 | 12/2016 | Okamura et al. | |

FOREIGN PATENT DOCUMENTS

| | | | |
|---|---|---|---|
| CN | 1407018 | A | 4/2003 |
| CN | 102153951 | A | 8/2011 |
| CN | 105793963 | A | 7/2016 |
| EP | 3082153 | A1 | 10/2016 |
| JP | 2003-171556 | A | 6/2003 |
| JP | 2011-142207 | A | 7/2011 |
| JP | 2013-001721 | A | 1/2013 |
| JP | 2015-115369 | A | 6/2015 |
| WO | 2010/035337 | A1 | 4/2010 |

OTHER PUBLICATIONS

International Search Report and Written Opinion received for PCT Patent Application No. PCT/EP2021/073214, mailed on Dec. 3, 2021, 8 pages.

* cited by examiner

*Primary Examiner* — Marc S Zimmer
(74) *Attorney, Agent, or Firm* — Faegre Drinker Biddle & Reath LLP

(57) ABSTRACT

To provide a polysilazane and a siliceous film-forming composition which can suppress film thickness variation and voids even in the ozone containing atmosphere. [Means for Solution] A polysilazane comprising N—Si bonds, wherein the ratio ($NA^3/NA^2$) of the number of N atoms having 3 N—Si bonds ($NA^3$) to the number of N atoms having 2 N—Si bonds ($NA^2$) is 1.8 to 6.0.

7 Claims, 1 Drawing Sheet

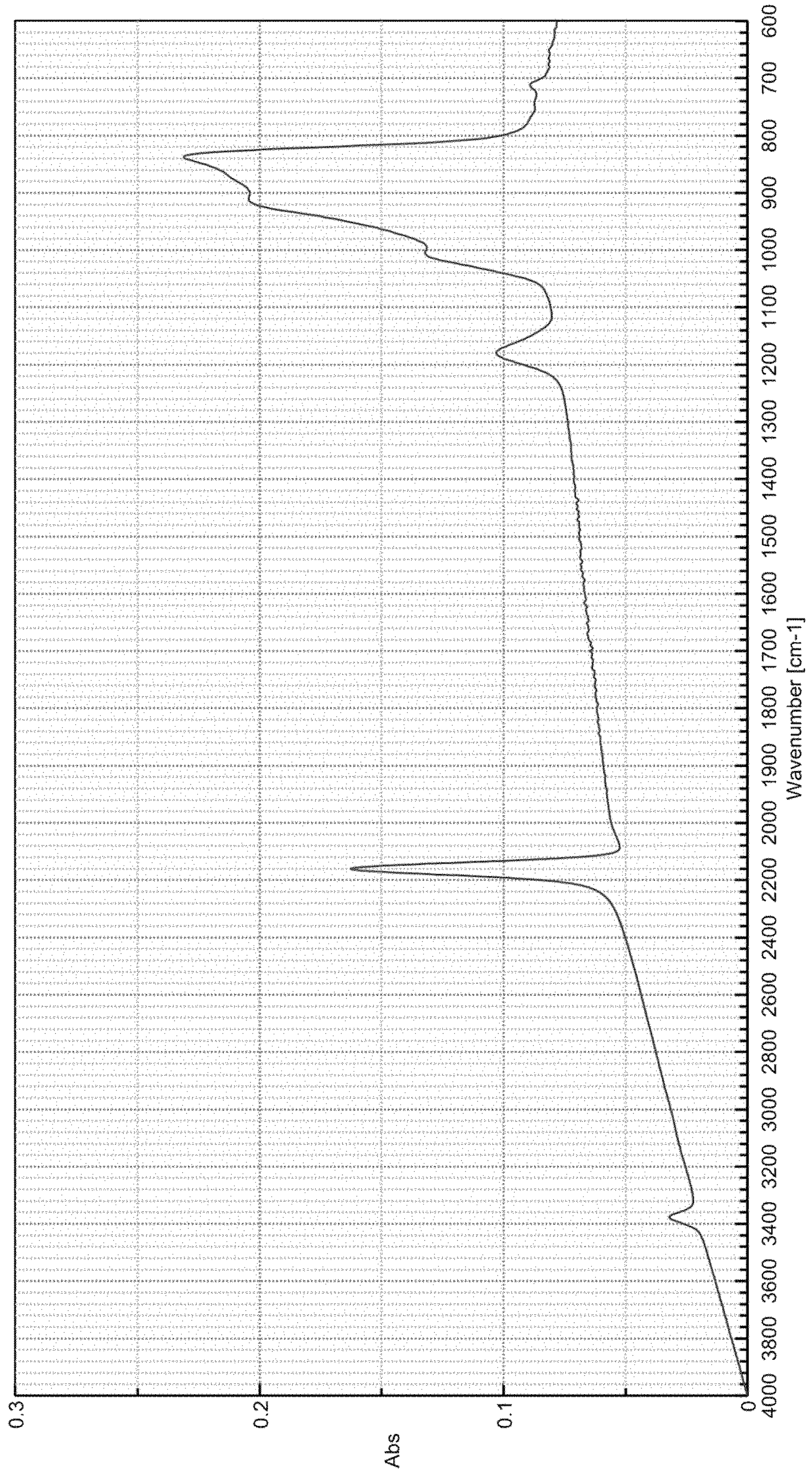
Abs
0
0.1
0.2
0.3
Wavenumber [cm-1]
4000
3800
3600
3400
3200
3000
2800
2600
2400
2200
2000
1900
1800
1700
1600
1500
1400
1300
1200
1100
1000
900
800
700
600

POLYSILAZANE, SILICEOUS FILM-FORMING COMPOSITION COMPRISING THE SAME, AND METHOD FOR PRODUCING SILICEOUS FILM USING THE SAME

CROSS-REFERENCE TO RELATED APPLICATIONS

This application is a National stage application (under 35 U.S.C. § 371) of PCT/EP2021/073214, filed Aug. 23, 2021, which claims benefit of Japanese Application No. 2020-140827, filed Aug. 24, 2020, both of which are incorporated herein by reference in their entirety.

BACKGROUND OF THE INVENTION

Technical Field

The present invention relates to a polysilazane and a siliceous film-forming composition comprising the same. The present invention also relates to a method for producing a siliceous film using them, a siliceous film, and an electronic device comprising the siliceous film.

Background Art

In the manufacture of electronic devices, especially semiconductor devices, an interlayer insulating film is sometimes formed between a transistor element and a bit line, between a bit line and a capacitor, between a capacitor and a metal wiring and between plural metal wirings, etc. Further, an insulating material is sometimes embedded in an isolation trench provided on a substrate surface or the like. Furthermore, after manufacturing a semiconductor device on a substrate surface, a coating layer is formed using a sealing material to form a package. Such an interlayer insulating film or coating layer is often formed of a siliceous material.

In the field of electronic devices, the device rule has been gradually miniaturized, and the size of an insulating structure etc. separating each element to be incorporated in the device, is also required to be miniaturized. However, with the progress of miniaturization of the insulating structure, occurrence of defects in a siliceous film constituting a trench etc. has been increasing, and problem of decline in the efficiency of manufacturing the electronic device is becoming bigger.

As a method for producing the siliceous film, a chemical vapor deposition method (CVD method), a sol-gel method, a method for coating and baking a composition comprising a silicon-containing polymer, and the like are used. Among them, a method for producing a siliceous film using a composition is often adopted, since it is relatively simple. In order to produce such a siliceous film, a composition comprising a silicon-containing polymer such as polysilazane, polysiloxane, polysiloxazane, or polysilane is coated on a substrate surface or the like and then baked, whereby silicon that is contained in the polymer is oxidized to form a siliceous film. In this case, methods for reducing defects of formed siliceous films have been studied. For example, forming siliceous films having less defects by using a composition comprising perhydropolysilazane having high stability against oxidation have been studied (Patent document 1).

PRIOR ART DOCUMENTS

PATENT DOCUMENTS

[Patent document 1] JP 2015-115369 A

SUMMARY OF THE INVENTION

Problems to be Solved by the Invention

Compositions comprising polysilazane form siliceous films under an atmosphere containing oxygen, and the present inventors found that when ozone is also present in the atmosphere, ozone can adversely affect the properties of the siliceous films. Thus, the development of polysilazane which can form siliceous films, where film thickness variation and defects can be suppressed even in the presence of ozone, is desired.

Means for Solving the Problems

The present invention provides a polysilazane comprising N—Si bonds, wherein the ratio ($NA^3/NA^2$) of the number of N atoms having 3 N—Si bonds ($NA^3$) to the number of N atoms having 2 N—Si bonds ($NA^2$) is 1.8 to 6.0.

Where the peak existing in 3500 to 3250 $cm^{-1}$ corresponding to N—H bonds and the peak existing in 1065 to 695 $cm^{-1}$ corresponding to Si—N bonds of the infrared absorption spectrum of the polysilazane are defined as absorbance corresponding to N—H bonds and Si—N bonds, respectively, the amount of N—H bonds and Si—N bonds/$cm^3$ (N) existing in a thin film having film thickness of d (cm) is determined by the following formula:

$$N=A\int a(\omega)/\omega \cdot d\omega$$

(wherein

A is a proportionality constant, $A_{N—H}$: 2.6×$102^{20}$ ($cm^{-2}$) as N—H bonds and $A_{Si—N}$: 7.7×$10^{18}$ ($cm^{-2}$) as Si—N bonds are used, a(ωw) is an absorption coefficient, ω is a wave number, a(ω)=1/d×absorbance×In10, and $NA^2$ is defined as amount of N—H bonds, and $NA^3$ is defined as [(amount of Si—N bonds)−(amount of N—H bonds)×2)]/3).

The siliceous film-forming composition according to the present invention comprises above mentioned polysilazane and a solvent.

The method for producing a siliceous film according to the present invention comprises applying above mentioned siliceous film-forming composition above a substrate and heating it.

The siliceous film according to the present invention is produced by above mentioned method.

The electronic device according to the present invention comprises the siliceous film produced by above mentioned method.

EFFECTS OF THE INVENTION

The polysilazane according to the present invention can form siliceous films, in which film thickness variation and the amount of voids can be suppressed even in the presence of ozone. Further, the obtained siliceous films also have features that its shrinkage during curing is small, and that cracks are hardly generated. Therefore, by forming electronic devices using compositions comprising the polysilazane, it is possible to improve the yield of electronic devices.

BRIEF DESCRIPTION OF THE DRAWING

FIG. 1 is an infrared absorption spectrum of an embodiment of the polysilazane according to the present invention.

DETAILED DESCRIPTION OF THE INVENTION

Mode for Carrying Out the Invention

[Definition]

Unless otherwise specified in the present specification, the definitions and examples described in this paragraph are followed.

The singular form includes the plural form and "one" or "that" means "at least one". An element of a concept can be expressed by a plurality of species, and when the amount (for example, % by mass or mol %) is described, it means sum of the plurality of species.

"And/or" includes a combination of all elements and also includes single use of the element.

When a numerical range is indicated using "to" or "-", it includes both endpoints and units thereof are common. For example, 5 to 25 mol % means 5 mol % or more and 25 mol % or less.

The descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

When polymer has a plural type of repeating units, these repeating units copolymerize. These copolymerization can be any of alternating copolymerization, random copolymerization, block copolymerization, graft copolymerization, or a mixture thereof. When polymer or resin is represented by a structural formula, n, m or the like that is attached next to parentheses indicate the number of repetitions.

Celsius is used as the temperature unit. For example, 20 degrees means 20 degrees Celsius.

Embodiments of the present invention are described below in detail.

[Polysilazane]

Polysilazane contains N—Si bonds as repeating units.

From the viewpoint of N atoms contained in the polysilazane, polysilazane can be roughly classified into 3 types, which are a nitrogen atom having 3 N—Si bonds (hereinafter also referred to as 3-functional nitrogen atom); a nitrogen atom having 2 N—Si bonds (hereinafter also referred to as 2-functional nitrogen atom); and nitrogen atom having 1 N—Si bond (hereinafter also referred to as 1-functional nitrogen atom).

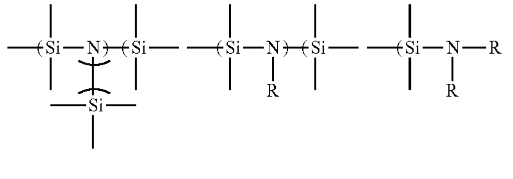

Wherein R is hydrogen or organic group.

In polysilazane, 3-functional nitrogen atom leads to a branched structure, 2-functional nitrogen atom leads to a straight-chain structure, and 1-functional nitrogen atom leads to a terminal structure.

In the polysilazane according to the present invention, the ratio ($NA^3/NA^2$) of the number of N atoms having 3 N—Si bonds ($NA^3$) to the number of N atoms having 2 N—Si bonds ($NA^2$) is 1.8 to 6.0, preferably 2.0 to 5.5, and more preferably 3.5 to 5.0.

Without wishing to be bound by theory, it is considered that N—R bonds of 2-functional nitrogen atom react with ozone to OR radicals and the OR radicals form oxide films around the surface of the coating films, which cause film thickness changes, and in the coating films the OR radicals produce vaporable compounds by breaking bonds of polysilazane and the compounds form voids by its expansion in heating processes. On the other hand, 3-functional nitrogen atom having no N—R bond does not produce OR radicals by reacting with ozone. Thus, it is considered that by setting the ratio of 3-functional nitrogen atoms and 2-functional nitrogen atoms within the above mentioned ratio, effects of suppressing production of voids and film thickness variation in the presence of ozone are achieved.

In polysilazane, less 1-functional nitrogen atoms are preferred. In concrete terms, the number of 1-functional nitrogen atoms is preferably 0.1% or less, and more preferably not included at all (0%), based on the number of all nitrogen atoms contained in the polysilazane. When the polysilazane is perhydropolysilazane described below, 1-functional nitrogen atom is usually not present in the molecule: in other words, the number of 1-functional nitrogen atoms is 0%.

$NA^3/NA^2$ can be measured in the following way.

A coating liquid comprising the polysilazane according to the present invention and a solvent is coat on a substrate and the solvent is volatilized for example by spin-dry, to form a coating film. In the infrared absorption spectrum obtained by measuring the coating film by a Fourier transform infrared spectroscopy, the peak existing in 3500 to 3250 $cm^{-1}$ corresponding to N—H bonds and the peak existing in 1065 to 695 $cm^{-1}$ corresponding to Si—N bonds are defined as absorbance corresponding to N—H bonds and Si—N bonds, respectively.

Regarding each range, the amount of N—H bonds and Si—N bonds/$cm^3$ (N) existing in a thin film having film thickness of d (cm) is determined by the following formula.

$$N=A\int a(\omega)/\omega \cdot d\omega$$

Wherein

A is a proportionality constant, $A_{N-H}$: $2.6\times10^{20}$ ($cm^{-2}$) as N—H bonds and $A_{Si-N}$: $7.7\times10^{18}$($cm^{-2}$) as Si—N bonds are used, $a(\omega)$ is an absorption coefficient, $\omega$ is a wave number, $a(\omega)=1/d\times absorbance\times In10$.

$NA^2$ is defined as amount of N—H bonds, and $NA^3$ is defined as [(amount of Si—N bonds)−(amount of N—H bonds)×2)]/3).

From the above results, $NA^2$ is defined as amount of N—H bonds, and $NA^3$ is defined as [(amount of Si—N bonds)−(amount of N—H bonds)×2)]/3). From the results of $NA^2$ and $NA^3$, $NA^3/NA^2$ is determined.

The polysilazane according to the present invention is preferably perhydropolysilazane (hereinafter, also referred to as PHPS). PHPS contains Si—N bonds as repeating units and consists only of Si, N and H. In this PHPS, except for the Si—N bonds, all the elements bonding to Si or N are H, and any other elements such as carbon or oxygen are not substantially contained.

The polysilazane according to the present invention preferably comprises at least one of the repeating units selected from the group consisting of the groups represented by the formulae (Ia) to (If), and the terminal group represented by the formula (Ig).

(Ia)

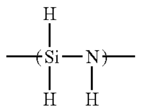

(Ib)

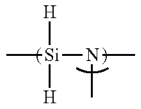

(Ic)

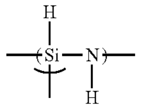

(Id)

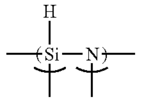

(Ie)

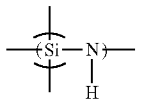

(If)

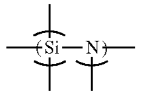

(Ig)

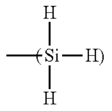

The polysilazane according to the present invention more preferably substantially consists of at least one of the repeating units selected from the group consisting of the groups represented by the formulae (Ia) to (If), and the terminal group represented by the formula (Ig). In the present invention, "substantially" means that 95% by mass or more of all the structural units contained in polysilazane are groups represented by the formulae (Ia) to (If), and the terminal group represented by the formula (Ig). More preferably, the polysilazane contains no structural units other than the groups represented by the formulae (Ia) to (If) and the terminal group represented by the formula (Ig), that is, it consists of at least one of the repeating units selected from the group consisting of the groups represented by the formulae (Ia) to (If) and the terminal group represented by the formula (Ig).

When the polysilazane according to the present invention is PHPS, it exhibits a certain characteristic value if assessed by the quantitative NMR. In particular, an analysis is performed by comparing the integral values of the signals derived from an internal standard material and a measuring target substance (internal standard method). When $^1H$-NMR is measured using xylene as an internal standard substance, (1) a relative value to the aromatic ring hydrogen in xylene of $SiH_2$ (corresponding to the above formulae (Ia) and (Ib)) and $SiH_1$ (corresponding to the above formulae (Ic) and (Id)) in a PHPS molecule (hereinafter referred to as "R($SiH_{1,2}$)") is preferably 0.220 or less, more preferably 0.200 or less, and more preferably 0.190 or less, and (2) a relative value to the aromatic ring hydrogen in xylene of total amount of NH (corresponding to the above formulae (Ia), (Ic), and (Ie)) (hereinafter referred to as "R(NH)") is preferably 0.055 or less. The above formula (If) can be ignored because it is not detected by $^1H$-NMR.

An example of partial structure of such polysilazane is one represented by the following.

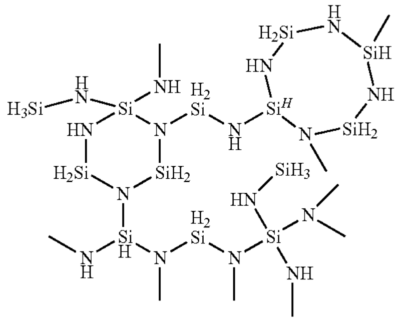

The mass average molecular weight of the polysilazane according to the present invention is not particularly limited, but it is preferred that the mass average molecular weight of polysilazane is large to reduce the low molecular weight components that scatter (evaporate) when converting to siliceous material, and prevent volume shrinkage due to the scattering of low molecular weight components, and consequently to prevent lower density inside the fine trenches. From this point of view, the mass average morecular weight of the polysilazane according to the present invention is preferably 4,000 or more, and more preferably 6,000 or more. On the other hand, when polysilazane is dissolved in a solvent to prepare a composition, it is necessary to increase coatability of the composition. In particular, it is needed to make the viscosity of the composition excessively high, and to control the curing rate of the composition in order to ensure the permeability of the composition into the uneven portion. From this point of view, the mass average molecular weight of the polysilazane according to the present invention is preferably 20,000 or less, and more preferably 18,000 or less. The mass average molecular weight is a weight average molecular weight in terms of polystyrene, and can be measured by the gel permeation chromatography based on polystyrene.

[Siliceous film-forming composition]

The siliceous film-forming composition according to the present invention (hereinafter referred to as the composition) comprises polysilazane according to the present invention and a solvent.

Solvents used in the present invention include (a) aromatic compounds, such as benzene, toluene, xylene, ethylbenzene, diethylbenzene, trimethylbenzene and triethylbenzene; (b) saturated hydrocarbon compounds, such as cyclohexane, decahydronaphthalene, dipentane, n-pentane, i-pentane, n-hexane, i-hexane, n-heptane, i-heptane, n-octane, i-octane, n-nonane, i-nonan, n-decane, ethylcyclohexane, methylcyclohexane, cyclohexane and p-mentane; (c) unsaturated hydrocarbons, such as cyclohexene; (d) ethers, such as dipropyl ether, dibutyl ether and anisole; (e) esters, such as n-butyl acetate, i-butyl acetate, n-amyl acetate and i-amyl acetate; and (f) ketones, such as methyl-isobutylketone (MIBK), but are not limited to these. Moreover, using plural kinds of solvents, solubility of polysilazane and evaporation rate of the solvent can be adjusted.

So as to improve the workability by the coating method to be adopted and further taking it into consideration that permeability of the solution into the fine trenches and the film thickness required outside the trenches, the blending amount of the solvent in the composition can be appropriately selected according to the mass average molecular weight of polysilazane to be used, and its distribution and structure. The composition according to the present invention comprises polysilazane of preferably 0.10 to 70% by mass, more preferably 1.0 to 30% by mass, based on the total mass of the composition.

[Method for forming a siliceous film]

The method for producing a siliceous film according to the present invention comprises applying the composition according to the present invention above a substrate and heating it. In the present invention, the "above a substrate" includes the case where the composition is applied directly on a substrate and the case where the composition is applied on a substrate via one or more intermediate layer.

The shape of the substrate is not particularly limited, and can be freely selected depending on the intended purpose. However, since the composition according to the present invention has a feature that it easily penetrates into narrow trenches or the like and can form a uniform siliceous film even inside the trenches, it is preferably applied to a substrate having trenches and holes with a high aspect ratio. In particular, it is preferably applied to a substrate having at least one trench with a width of the deepest portion of 0.02 μm or less and an aspect ratio of 20 or more. The shape of the trench is not particularly limited, and the cross section thereof can be any shape such as a rectangular shape, a forward tapered shape, a reverse tapered shape and a curved surface shape. Both ends of the trench can be open or closed.

In the conventional method, even if an attempt is made to fill a trench having a width of the deepest part of 0.02 μm or less and an aspect ratio of 20 or more with a siliceous material, the density of inside the trench was reduced than that of outside the trench due to the large volume shrinkage at the time of conversion to siliceous material, and thus it was difficult to fill the trenches so that the material was homegeneous inside and outside the trenches. On the contrary, according to the present invention, a uniform siliceous film can be obtained inside and outside the trench. Such an effect of the present invention becomes more remarkable when a substrate having very fine trenches such as a width of 0.01 pm or less at the deepest portion is used.

Typical examples of the substrate having at least one trench with a high aspect ratio include a substrate for an electronic device comprising a transistor device, a bit line, a capacitor, and the like. For the production of such electronic devices, following steps are comprised in some cases: a step of forming an insulating film between a transistor device and a bit line called PMD, between a transistor device and a capacitor, between a bit line and a capacitor or between a capacitor and a metal wiring, and an insulating film between a plurality of metal wirings called IMD, or a step of filling an isolation trench, and a followed through-hole formation step of forming a hole that vertically penetrates the material filled in the fine trench.

The present invention is suitable also for any other application in which a substrate having a high aspect ratio is required to be filled with a homogeneous siliceous material inside and outside the trench.

Examples of such applications include undercoating of glass for liquid crystal panel (passivation film for such as Na), overcoating of liquid crystal color filter (insulating planalization film), gas barrier of film liquid crystal, hard coating of substrate (metal, glass), heat/oxidation resistant coating, antifouling coating, water-repellent coating, hydrophilic coating, ultraviolet ray cutting coating for glass or plastic, and colored coating.

The method for applying the curing composition above such a substrate is not particularly limited, and examples thereof include any usual application method, such as a spin coating method, a dipping method, a spraying method, a transfer method, and a slit coating method.

After application of the curing composition, a drying step is performed for the purpose of drying or pre-curing of the coating film in accordance with the treating conditions of 10 seconds to 30 minutes at a temperature of 50 to 400° C., in the air, an inert gas or an oxygen gas. The solvent is removed by drying and the fine trenches are substantially filled with polysilazane.

According to the present invention, polysilazane contained inside and outside the trenches is converted into a siliceous material by heating. When heating, it is preferable to heat in a steam atmosphere.

The steam atmosphere means an atmosphere in which the partial pressure of steam is in the range of 0.50 to 101 kPa, preferably 1.0 to 90 kPa, and more preferably 1.5 to 80 kPa. The heating can be carried out in the temperature range of 300 to 1,200° C.

If the heating is performed in an atmosphere containing steam at a high temperature, for example, at a temperature exceeding 600° C. and the other elements such as electronic devices that are simultaneously exposed to the heat treatment, there is a concern that the other elements can be adversely effected. In such cases, the siliceous material conversion step can be divided into two or more steps, in which heating can be performed first in an atmosphere containing steam at a relatively low temperature, for example, in a temperature range of 300 to 600° C. and then in an atmosphere containing no steam at a higher temperature, for example, in a temperature range of 500 to 1200° C.

Any gas can be used as a component other than steam in an atmosphere containing steam (hereinafter referred to as the dilution gas), and particular examples thereof include air, oxygen, nitrogen, helium, and argon. As the dilution gas, it is preferable to use oxygen in terms of the film quality of the siliceous material to be obtained. However, the dilution gas is appropriately selected in consideration also of the influence on other elements such as electronic devices that are exposed to the heat treatment. In addition, as the atmosphere containing no steam in the above-mentioned two-step heating method, in addition to the atmosphere containing any of the above-mentioned dilution gases, a reduced pressure or vacuum atmosphere of less than 1.0 kPa can also be adopted.

Examples of suitable heating conditions, which are set considering these circumstances, are listed below:

(1) after applying the composition according to the present invention to a given substrate and drying, to heat within a temperature range from 300 to 600° C. and in an atomosphere wherein the water vapor partial pressure is within 0.50 to 101 kPa, and subsequently to heat within a temperature range from 400 to 1200° C. and in an atmosphere wherein the oxygen partial pressure is within a range from 0.5 to 101 kPa;

(2) after applying the composition according to the present invention to a given substrate and drying, to heat within a temperature range from 300 to 600° C. and in an atmosphere wherein the water vapor partial pressure is within 0.50 to 101 kPa, and subsequently to heat within a temperature range from 400 to 1200° C. and in an atmosphere where containing one or more inert gas selected from nitrogen, helium and argon; and (3) after applying the composition according to the present invention to a given substrate and drying, to heat within a temperature range from 300 to 600° C. and in an atmosphere wherein the water vapor partial pressure is within 0.50 to 101 kPa, and subsequently to heat within a temperature range from 400 to 1200° C. and in an a pressure-reduced atmosphere of less than 1.0 kPa or a vacuum atmosphere.

There are no particular restrictions on the heating rate and the cooling rate to the target temperature during heating, and it can generally be in the range of 1° C. to 100° C./min. The holding time after reaching the target temperature is not particularly limited, and it can generally be in the range of 1 minute to 10 hours.

By the above heating step, polysilazane is converted to a siliceous material mainly composed of Si—O bonds through a hydrolysis reaction with steam. When a siliceous film is formed on the surface of a substrate having a trench with a high aspect ratio using the composition according to the present invention, it becomes homogeneous both inside and outside the trench. According to the method of the present invention, since there is no conformality like the CVD method, filling inside the fine trench can be uniformly performed. Further, although densification of the siliceous film according to the conventional method was insufficient, densification of the film after conversion to siliceous material according to the method of the present invention is promoted, and cracks are less likely to occur.

As described above, since the siliceous film according to the present invention is obtained by the hydrolysis reaction of polysilazane, it is mainly composed of Si—O bonds, but also contains some Si—N bonds depending on the degree of conversion. That is, the fact that some Si—N bonds are contained in the siliceous material indicates that the material is derived from polysilazane. In particular, the siliceous film according to the present invention contains nitrogen in the range of 0.005 to 5% by atomic percentage. In fact, it is difficult to reduce this nitrogen content below 0.005%. The atomic percentage of nitrogen can be measured by the secondary ion mass spectrometry.

In methods for coating a conventional sol-gel method or siloxane-based polymer solution, or method using a polysilazane containing an organic group, a large volumetric shrinkage occurs during the conversion to a siliceous material. Therefore, employing these methods, when trenches of high aspect ratio are filled by a siliceous material, the siliceous material inside the trenches tends to become heterogeneous with respect to density, and the film density is lowered. In the case of the siliceous film according to the present invention, small volume shrinkage occurs during the conversion to a siliceous material, the siliceous material becomes more homogeneous inside and outside of the trenches, and the density of the coating film formed by the siliceous material conversion can be improved furthermore by stabilizing the oxidation reactivity.

When a volume shrinkage occurs during the conversion to a siliceous material between several trenches having a different trench width, the finer a trench is, the larger the influence of the constraint by the trench wall becomes and the lower the density of the siliceous material tends to be obtained. In the case of the siliceous film according to the present invention, small volume shrinkage occurs during the conversion to a siliceous material, so that the density becomes uniform in spite of different trench widths.

In the method for forming a siliceous film according to the present invention, the thickness of the siliceous film formed on the surface of the substrate and the thickness of the coating film formed on the surface outside the trench are not particularly limited, and they can generally be any thickness within a range in which no crack occurs in the film during conversion to siliceous material. As described above, according to the method of the present invention, cracks are unlikely to occur in the coating firm even when the film thickness is 0.5 μm or more. Therefore, for example, in a contact hole having a width of 1000 nm, a trench having a depth of 2.0 μm can be filled substantially without any defect.

The method for producing an electronic device according to the present invention comprises the above-mentioned producing method.

EXAMPLE

The present invention is described below by use of the various examples. In addition, aspects of the present invention are not limited only to these examples.

[Synthesis of Intermediate (A)]

After replacing the inside of a 10 L reaction vessel equipped with a cooling condenser, a mechanical stirrer and a temperature control device with dry nitrogen, 7,500 ml of dry pyridine is put into the reaction vessel and cooled to −3° C. Thereafter, 500 g of dichlorosilane is added to produce a white solid adduct ($SiH_2Cl_2$. $2C_5H_5N$). Upon confirming that the reaction mixture become −3° C. or less, 350 g of ammonia is slowly blown into the reaction mixture while stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 6,000 ml of a filtrate. Pyridine is distilled off using an evaporator and xylene is added, to obtain a xylene solution of polysilazane having a concentration of 39.8% by mass. The mass average molecular weight of the obtained polysilazane (hereinafter referred to as Mw) is measured by gel permeation chromatography and is 1,280 in terms of polystyrene. The polysilazane obtained in accordance with this formulation is hereinafter referred to as Intermediate (A).

The GPC is measured using an Alliance (TM) e2695 type high-speed GPC system (Nihon Waters K.K.) and a Super Multipore HZ-N type GPC column (Tosoh Corporation). The measurement is carried out using monodisperse polystyrene as a standard sample and chloroform as a developing solvent under the measuring conditions of a flow rate of 0.6 ml/min and a column temperature of 40° C., and then the mass average molecular weight is calculated as a relative molecular weight to the standard sample.

Following Mw is measured in the same manner.

[Synthesis example 1: Synthesis of Polysilazane 1]

After replacing the inside of a 10 L reaction vessel equipped with a cooling condenser, a mechanical stirrer and a temperature control device with dry nitrogen, 4,710 g of dry pyridine, 150 g of dry xylene, and 1,650 g of above obtained Intermediate (A) having a concentration of 39.8% by mass are introduced, and the mixture is stirred so as to be uniform while bubbling with nitrogen gas of 0.5 NL/min. Subsequently, a reforming reaction is carried out at 100° C. for 12.6 hours to obtain Polysilazane 1. Mw is 4,600. The relative value to the aromatic ring hydrogen in xylene of $SiH_2$ and $SiH_1$ ($R(SiH_{1,2})$) is 0.195, and the relative value to the aromatic ring hydrogen in xylene of total amount of NH (corresponding to the above formulae (Ia), (Ic), and (Ie)) (R(NH)) is 0.048. $NA^3/NA^2$ is 2.52.

In the examples, $NA^3/NA^2$ is measured in the following way.

A coating liquid is prepared using Polysilazane 1 and xylene, and the concentration is controlled so that the film thickness becomes 250 nm. The coating liquid is coated on a high resistance n-type Si 4-inch wafer using a spin coater 1HDX2 (manufactured by Mikasa Co., Ltd.) and spin-dried, to form 250 nm of coating film. The film thickness is measured by M-44 spectroscopic ellipsometer (manufactured by J A Woollam). The infrared absorption spectrum is obtained using a Fourier transform infrared spectroscopy FTIR-6600FV (manufactured by JASCO Corporation) in a measuring condition of transmission method, cumulated number: 100 times, measurement temperature: room temperature, and measurement atmosphere: vacuum. In the obtained infrared absorption spectrum, absorbance of N—H bonds is determined by drawing a baseline in 3500 to 3250 $cm^{-1}$, and absorbance of Si—N bonds is determined by drawing a baseline in 1065 to 695 $cm^{-1}$.

Regarding each range, the amount of N—H bonds and Si—N bonds/$cm^3$ (N) existing in a thin film having film thickness of d (cm) is determined by the following formula.

$$N=A\int a(\omega)/\omega \cdot d\omega$$

Wherein

A is a proportionality constant, $A_{N—H}$: $2.6\times10^{20}$ ($cm^{-2}$) as N—H bonds and $A_{Si—N}$: $7.7\times10^{18}$ ($cm^{-2}$) as Si—N bonds are used, a(ω) is an absorption coefficient, w is a wave number, a(ω)=1/d×absorbance×In10.

$NA^2$ is defined as amount of N—H bonds, and $NA^3$ is defined as [(amount of Si—N bonds)−(amount of N—H bonds)×2)]/3).

From the above results, $NA^2$ is defined as amount of N—H bonds, and $NA^3$ is defined as [(amount of Si—N bonds)−(amount of N—H bonds)×2)]/3). From the results of $NA^2$ and $NA^3$, $NA^3/NA^2$ is determined.

[Synthesis example 2: Synthesis of Polysilazane 2]

Synthesis is carried out in the same manner as in Synthesis example 1 except that reforming reaction is carried out at 110° C. for 9.1 hours, to obtain Polysilazane 2. Mw is 5,800, $R(SiH_{1,2})$ is 0.195, R(NH) is 0.045, and $NA^3/NA^2$ is 3.37.

[Synthesis example 3: Synthesis of Polysilazane 3]

Synthesis is carried out in the same manner as in Synthesis example 1 except that reforming reaction is carried out at 110° C. for 10.0 hours, to obtain Polysilazane 3. Mw is 8,300, $R(SiH_{1,2})$ is 0.185, R(NH) is 0.043, and $NA^3/NA^2$ is 3.95.

[Synthesis example 4: Synthesis of Polysilazane 4]

Synthesis is carried out in the same manner as in Synthesis example 1 except that reforming reaction is carried out at 120° C. for 8.2 hours, to obtain Polysilazane 4. Mw is 12,400, $R(SiH_{1,2})$ is 0.180, R(NH) is 0.040, and $NA^3/NA^2$ is 4.34.

[Comparative Synthesis example 1: Synthesis of Polysilazane 5]

Synthesis is carried out in the same manner as in Synthesis example 1 except that reforming reaction is carried out at 100° C. for 11.2 hours, to obtain Polysilazane 5. Mw is 2,200, $R(SiH_{1,2})$ is 0.242, R(NH) is 0.058, $NA^3/NA^2$ is 1.48.

[Film thickness change under atomosphere containing ozone]

A coating liquid is prepared using the polysilazane obtained by each synthesis example and xylene, and the concentration is controlled so that the film thickness becomes 580 nm. The obtained coating liquid is spin-coated on a 4-inch wafer using a spin coater 1HDX2 (manufactured by Mikasa Co., Ltd.) at 1000 rpm. The obtained coating film is heat-treated at 150° C. for 3 minutes under ozone concentration of 10 ppb generated by uvistare ozone deodorizer. The ozone concentration is measured by EG-3000F (manufactured by EBARA JITSUGYO CO., LTD.). The film thickness before and after the heat treatment is measured by M-44 spectroscopic ellipsometer (manufactured by JA Woollam), which is regarded as film thickness change under ozone atmosphere.

[Number of voids]

The coating liquid is coated at 1000 rpm using a spin coater Mark8 (manufactured by Tokyo Electron Co., Ltd.) on a 8-inch wafer having trenches of 20 nm width and 500 nm depth. The obtained coating film is baked at 150° C. for 3 minutes under ozone concentration of 10 ppb. Thereafter, it is cured in a furnace VF1000LP (manufactured by Koyo Thermo Systems Co., Ltd.) under a steam atmosphere at 400° C. for 30 minutes and then under a nitrogen atmosphere at 600° C. Trench pattern portions of the cured wafer is cut perpendicular to the trench direction, and then immersed in an aqueous solution containing 5% by mass of ammonium fluoride and 0.5% by mass of hydrofluoric acid for 30 seconds, and rinsed with pure water, and then dried. It is observed using Scanning Electron Microscope S-4700 (manufactured by Hitachi High-Tech Corporation). 300 points of trenches are observed and the number of trenches in which voids are confirmed are set as the number of voids.

The obtained results are shown in Table 1.

Synthesis example 2 also shows results of film thickness changes and number of voids under ozone concentration of 0 ppb.

TABLE 1

| | Polysilazane | Mw | $NA^3/NA^2$ | Ozone concentration (ppb) | Film thickness changes under ozone atmosphere (nm) | number of voids |
|---|---|---|---|---|---|---|
| Synthesis example 1 | Polysilazane 1 | 4.600 | 2.52 | 10 | 4 | 0 |
| Synthesis example 2 | Polysilazane 2 | 5.800 | 3.37 | 10 | 4 | 0 |
| | | | | 0 | 0 | 0 |
| Synthesis example 3 | Polysilazane 3 | 8.300 | 3.95 | 10 | 3 | 0 |
| Synthesis example 4 | Polysilazane 4 | 12.400 | 4.34 | 10 | 3 | 0 |
| Comparative synthesis example 1 | Polysilazane 5 | 2.200 | 1.48 | 10 | 8 | 20 |

The invention claimed is:

1. A method for producing a siliceous film, comprising applying a siliceous film-forming composition comprising a polysilazane comprising N—Si bonds, wherein the ratio ($NA^3/NA^2$) of the number of N atoms having 3 N—Si bonds ($NA^3$) to the number of N atoms having 2 N—Si bonds ($NA^2$) is 1.8 to 6.0, where the peak existing in 3500 to 3250 $cm^{-1}$ corresponding to N—H bonds and the peak existing in 1065 to 695 $cm^{-1}$ corresponding to Si—N bonds of the infrared absorption spectrum of the polysilazane are defined as absorbance corresponding to N—H bonds and Si—N bonds, respectively, the amount of N—H bonds and Si—N bonds/$cm^3$ (N) existing in a thin film having film thickness of d (cm) is determined by the following formula:

$$N=A\int a(\omega))/\omega \cdot d\omega$$

(wherein

A is a proportionality constant, $A_{N—H}$: 2.6×1020 ($cm^{-2}$) as N—H bonds and $A_{Si—N}$: $7.7\times10^{18}$($cm^{-2}$) as Si—N bonds are used, a(ω) is an absorption coefficient, w is a wave number, a(ω)=1/d×absorbance×ln10, and $NA^2$ is defined as amount of N—H bonds, and $NA^3$ is defined as [(amount of Si—N bonds)−(amount of N—H bonds)×2)]/3), and a solvent above a substrate, and heating it under an ozone atmosphere.

2. The method according to claim 1, wherein the polysilazane is perhydropolysilazane.

3. The method according to claim 1, comprising at least one of the repeating units selected from the group consisting of the groups represented by the formulae (Ia) to (If), and the terminal group represented by the formula (Ig)

(Ia)

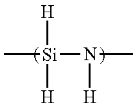

(Ib)

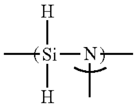

-continued (Ic)

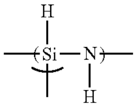

(Id)

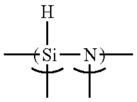

(Ie)

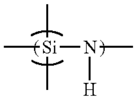

(If)

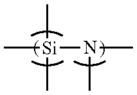

(Ig)

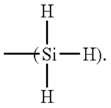

4. The method according to claim 1, wherein $NA^3/NA^2$ is 2.0 to 5.5.

5. The method according to claim 1, wherein the mass average molecular weight in terms of polystyrene measured by gel permeation chromatography is 4,000 to 20,000.

6. A siliceous film produced by the method according to claim 1.

7. An electronic device comprising the siliceous film produced by the method according to claim 1.

* * * * *